(12) United States Patent
Chamberlin

(10) Patent No.: US 8,427,179 B2
(45) Date of Patent: Apr. 23, 2013

(54) QUICK CONNECT SENSOR APPARATUS

(75) Inventor: Edward R. Chamberlin, Loveland, OH (US)

(73) Assignee: Standex International Corporation, Salem, NH (US)

( * ) Notice: Subject to any disclaimer, the term of this patent is extended or adjusted under 35 U.S.C. 154(b) by 319 days.

(21) Appl. No.: 12/928,192

(22) Filed: Dec. 6, 2010

(65) Prior Publication Data

US 2011/0133759 A1 Jun. 9, 2011

Related U.S. Application Data

(60) Provisional application No. 61/283,715, filed on Dec. 8, 2009.

(51) Int. Cl.
*G01R 27/26* (2006.01)
*G01R 31/00* (2006.01)

(52) U.S. Cl.
USPC ..................................... 324/682; 324/750.16

(58) Field of Classification Search ................... 324/682, 324/681, 658, 649, 600, 220, 750.16; 702/150, 702/151, 94; 340/456, 524, 815.58, 854.1, 340/987; 73/1.23, 1.79, 314
See application file for complete search history.

(56) References Cited

U.S. PATENT DOCUMENTS

| 4,465,105 | A | * | 8/1984 | Slater | 138/104 |
| 4,952,875 | A | * | 8/1990 | Adams et al. | 324/220 |
| 5,070,328 | A | * | 12/1991 | Fockens | 340/10.42 |
| 5,798,697 | A | * | 8/1998 | Wiseman | 340/610 |
| 8,058,879 | B1 | * | 11/2011 | Atherton | 324/510 |

* cited by examiner

*Primary Examiner* — Hoai-An D Nguyen
(74) *Attorney, Agent, or Firm* — William B. Ritchie

(57) ABSTRACT

An electronic sensor for determining if a metal hose connector is fully snapped into its mating plastic connector. This sensor detects the metal hose in position by having a coil in position over the plastic connector and at the end of the metal hose when it is in correct position. The metal of the hose interacts with the magnetic field of the coil to both increase the inductance and greatly reduce the 'Q' because of the "shorted turn" effect of the round metal hose. The sensor inherently detects faults in its own circuit because of the comparator voltage window. Faults such as an open coil, oscillator or rectifier failure will appear at the output as "hose disconnected" which is the desirable failure mode. The invention also detects external faults because of the two non-zero, non-line voltages seen during normal operation.

12 Claims, 5 Drawing Sheets

QUICK CONNECT SENSOR APPARATUS

This application claims benefit of U.S. Provisional Application Ser. No. 61/283,715 filed Dec. 8, 2009, pursuant to 35 USC §119(e).

FIELD OF THE INVENTION

This invention relates to sensors for automobiles that provide diagnostic data for an automotive electronic control module (ECM), in particular, a sensor that determines whether a hose is connected properly at the intake fitting for the hose.

BACKGROUND OF THE INVENTION

Modern automotive vehicles make use of computer technology to accomplish a number of functions including assisting the repair technician in diagnosing problems with the unit. The part responsible for this diagnostic capability is the ECM, which stands for the "Engine Control Module". This computer receives information from various automotive components (depending on the manufacturer) to enable the serviceperson to accurately and quickly focus on the problem that needs to be addressed. In V-8 diesel engines that have turbo systems hose connections, a closed crankcase ventilation (CCV) system is utilized. This CCV filters out oil, etc. before the re-combustion of gases and provides a closed system in order to meet Federal emissions regulations. As part of this system, a metal hose is provided that must be connected to a plastic fitting that is provided at the crankcase. The area around this connection is quite small so that little room is available for extra structures. To ensure that this hose is properly connected, it is desirable to have a sensor that is capable of determining whether this hose is properly connected. At present, there is nothing in the prior art that can detect whether the hose is properly connected; can fit within the tight boundaries available; will fail safely should the sensor malfunction, and provide an accurate robust signal that can be read by the ECM.

SUMMARY OF THE INVENTION

It is an aspect of the invention to provide a quick connect sensor that reliably detects whether a metal hose is properly connected to a fitting.

Another aspect of the invention is to provide a quick connect sensor that fails safely, in other words, faults such as an unplugged sensor, or output shorted to ground or output shorted to the supply voltage, faults in the sensor circuitry such as an open coil, oscillator or rectifier will be detected.

Another aspect of the invention is to provide a quick connect sensor that has two comparators connected to create a voltage window such that if the voltage is above or below a specified limits, the combined outputs will indicate if the voltage is within the specified window.

It is still another aspect of the invention to provide a quick connect sensor wherein the combined outputs of two comparators is connected to a resistive network to provide one of two voltages between ground and supply such that other voltages measured will indicate a fault because the measured voltage is not of the two outputs for normal sensor operation.

Another aspect of the invention is to provide a quick connect sensor that uses a simple oscillator to provide a constant frequency to a resonant circuit wherein the oscillator does not need to have a sine wave output but can be a square wave output for simpler circuit design.

Another aspect of the invention is to provide a quick connect sensor that uses a predetermined coil and corresponding capacitor having a resonance at the same frequency as the driving oscillator.

Still another aspect of the invention is to provide a quick connect sensor that uses two series capacitors as the resonant capacitor wherein the two series capacitor may be driven at the junction of the two for best impedance matching from oscillator output to resonant circuit.

Another aspect of the invention is to provide a quick connect sensor that includes a rectifier to create a DC voltage proportional to the AC voltage at the peak of the resonant circuit.

Finally, it is an aspect of the invention to provide a quick connect sensor that reliably detects the presence of a metal hose properly attached to its attachment fitting by both the resulting shift in resonate frequency of the coil capacitor combination and the loss of 'Q' due the to the "shorted turn effect" of the round metal hose.

DETAILED DESCRIPTION OF THE INVENTION

Figure 1:
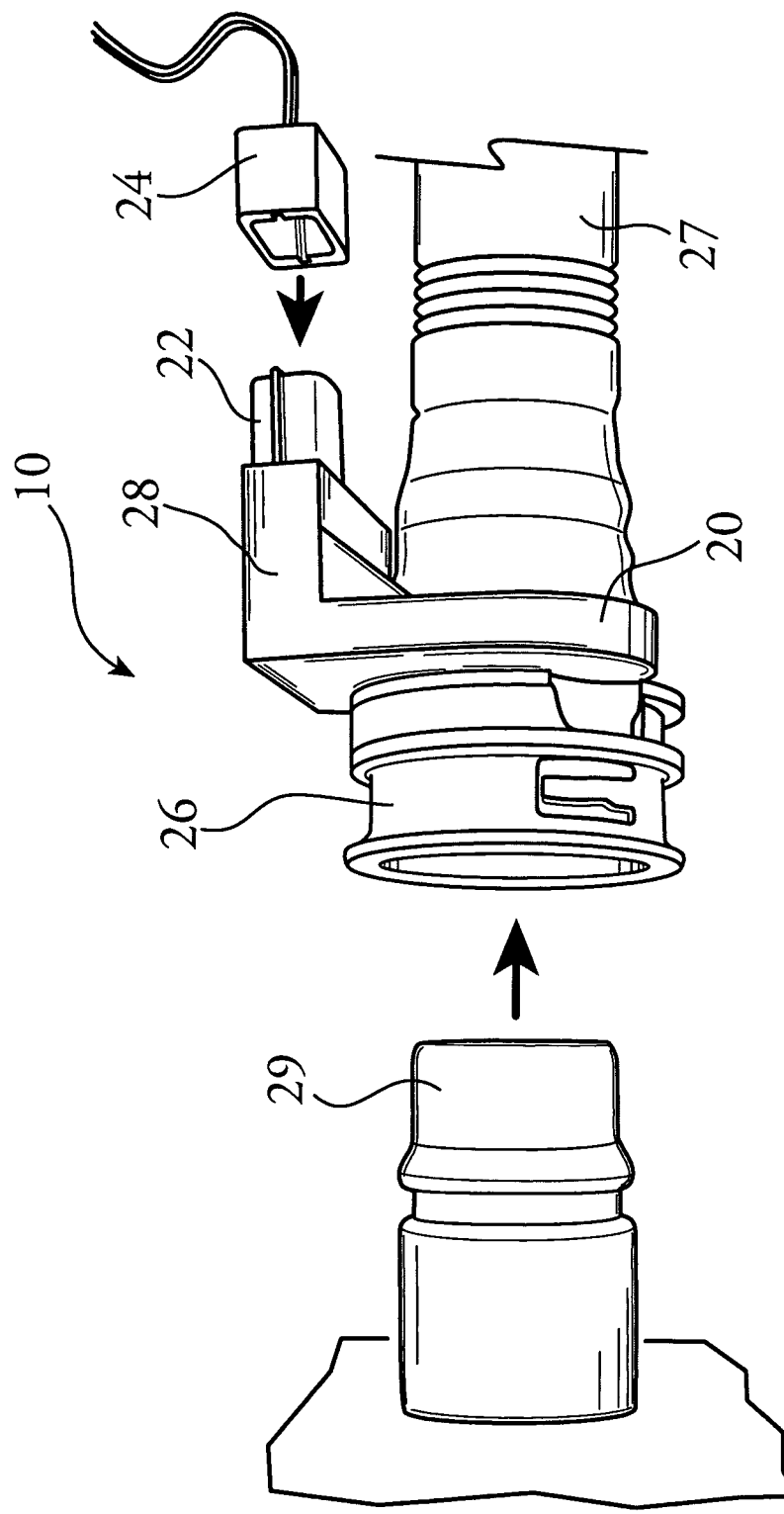
FIG. 1 is an isometric exploded view of the invention showing the invention and hose connected to a typical crankcase fitting.

As shown in FIG. 1, invention 10 is a molded plastic housing 28 that is includes a plastic quick connect fitting 26 that can be quickly attached to a crankcase intake fitting 27. This is the type of system that is typically used in a closed crankcase ventilation system that is used to filter out oil, etc. before the recombustion of gases to meet emissions regulations. Ring 20 of housing 28 has sufficient diameter to allow a metal hose 27, that is to be attached to fitting 26, to pass therethrough so that the hose may attach the crankcase intake fitting 29 of the engine to provide closed crankcase ventilation. Receiver 22 is dimensioned such that a standard quick connector fitting 24 will easily attach thereto. Fitting 24 provides power to invention 10 via the vehicle's electrical system and fits into receiver 22 of housing 28. Receiver 22 also provides data output to provide sensor information to the vehicle's ECM.

Figure 2:
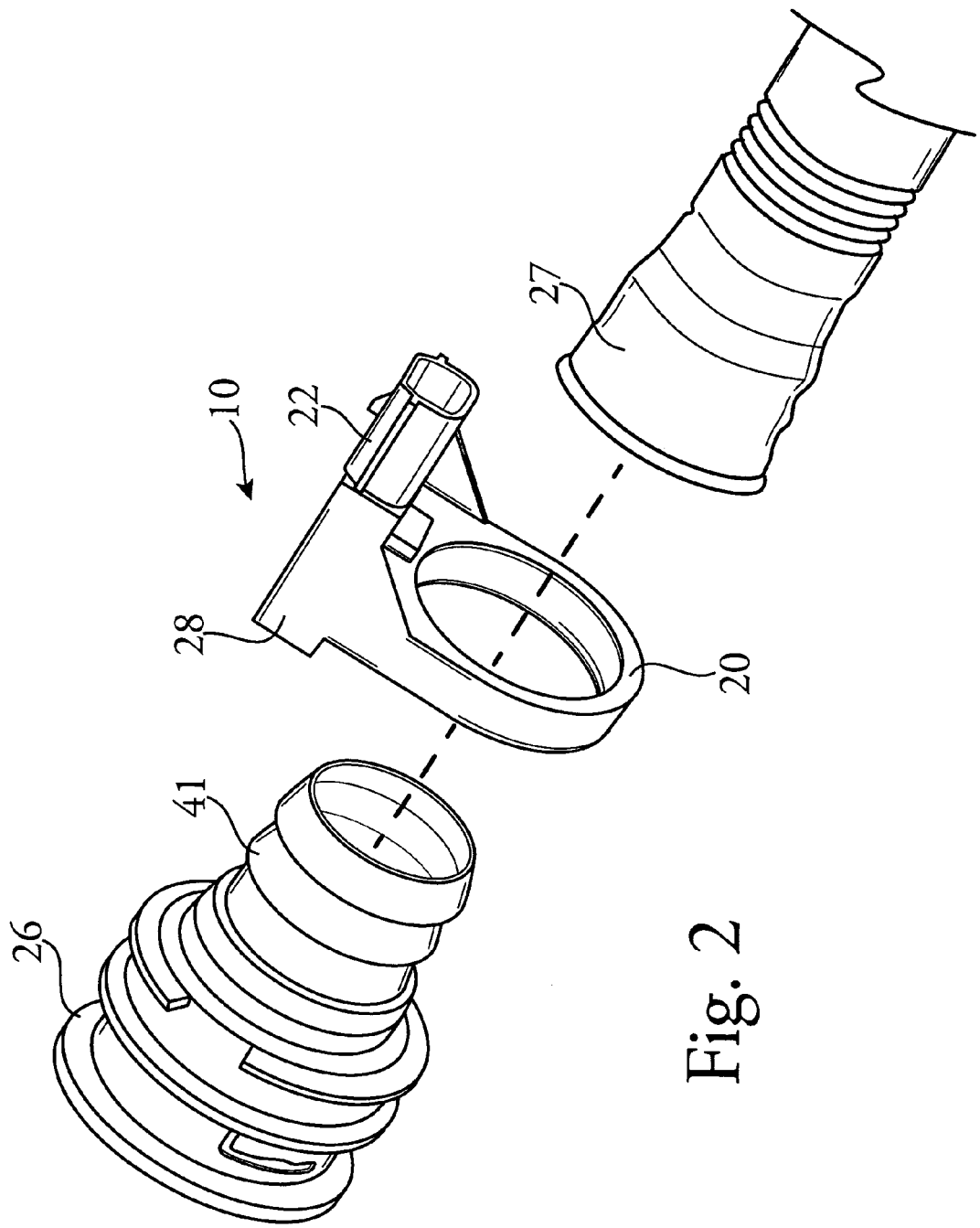
FIG. 2 is an isometric exploded view of the invention showing the hose attached to the invention.

As shown in FIG. 2, invention 10 is preferably in two parts: quick connect fitting 26 and housing 28, which includes receiver 22. A barb type fitting 41 is preferably provided on quick connect fitting 26 so that hose 27 may be easily attached thereto.

Figure 3:
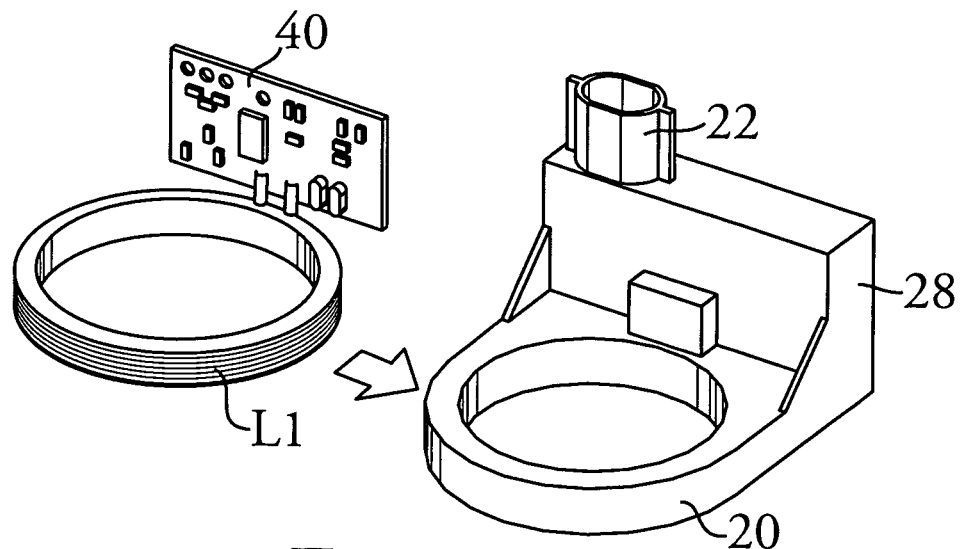
FIG. 3 is a detailed isometric view of the coil and the printed circuit board.
Figure 4:
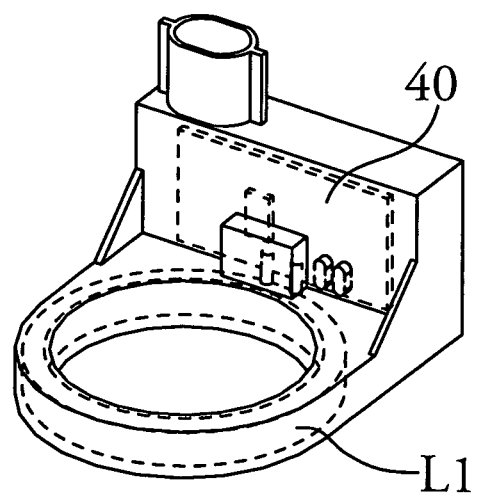
FIG. 4 is a detailed isometric exploded view of the coil and printed circuit board within the housing.

As shown in FIG. 3, the primary major components of invention 10 are illustrated. Coil L1 is preferably 5.4 mH plus or minus 1%, having a Q of 36, with 270 turns of No. 36 gauge wire, using about 180 feet of wire. A printed circuit board 40 contains the components and circuitry described in FIG. 4. Board 40 and L1 are connected to one another. Board 40 is housed in housing 28 and Coil L1 is contained within ring 20 as shown in FIG. 4.

Figure 5:
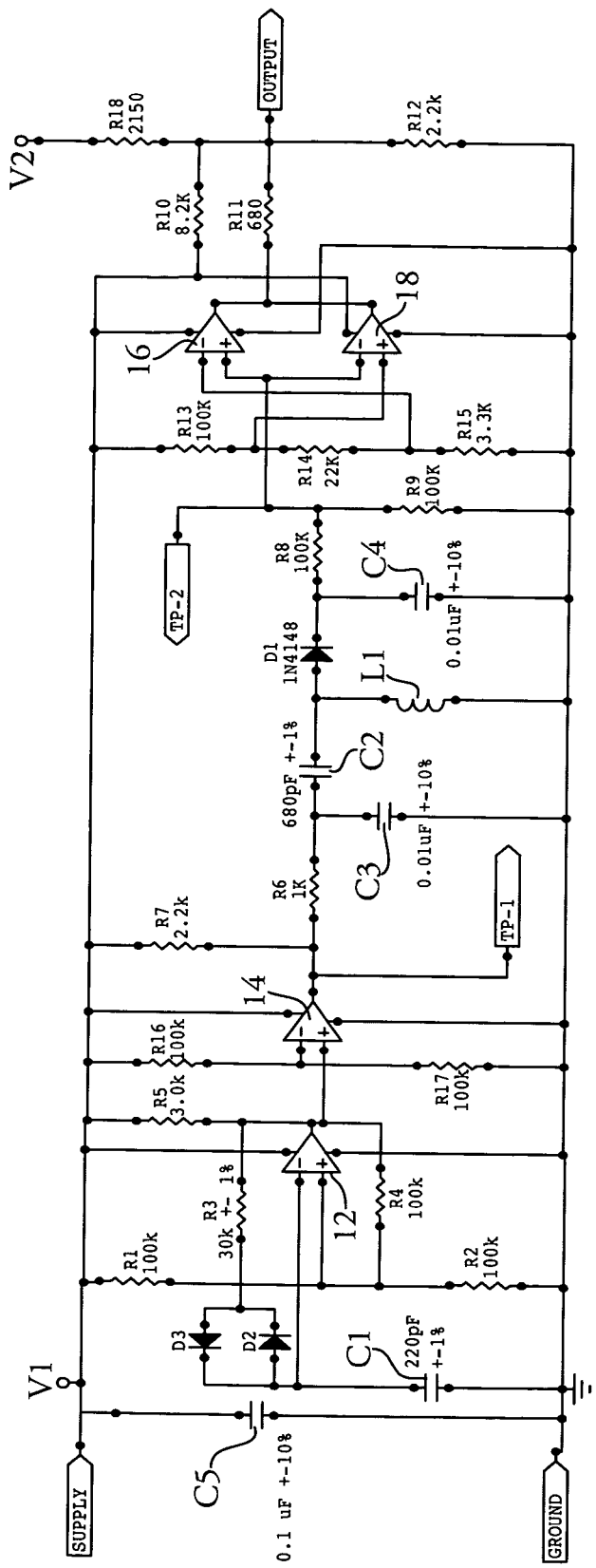
FIG. 5 is a schematic of the preferred circuit in accordance with the invention.

As shown in FIG. 5, the circuitry consists of an integrated circuit that uses preferably an LM2901DT quad comparator such as manufactured by Fairchild Semi Conductor of Huntsville, Ala. among others. Comparator 12 is used as an oscillator; comparator 14 is an oscillator buffer; comparators 16 and 18 are used for construction of a voltage window and output. Note that parts used in automotive applications must meet industry high temperature standards.

The vehicle battery powers invention 10. V1 is 12 volts and V2 is 5 volts. First comparator 12, combined with R1, R2, R3, R4, R5 and C1 provides an oscillator that generates a 88 kHz signal as determined by the RC time constant provided by C1 and R3. The oscillator is provided by connecting C1, R1, R2, R3, R4, and R5 with comparator 12 as shown. The preferable values for these components are as shown in FIG. 5.

Comparator 14 is used as a buffer between the oscillator and resonate circuit. In this manner, comparator 14 prevents a type of hysteresis problem that can occur due to feedback from the resonant circuit impedance, thus causing the oscillator frequency to jump just at resonance.

The output from this oscillator is connected through a buffer to a capacitor impedance matching resonated circuit C3 and C2, which includes the sensing coil L1, which is imbedded into ring 20.

The output of coil L1 goes to rectifier D1. D1 is preferably a 1N4148 diode, such as also manufactured by Fairchild Semi Conductor. D1 is connected to C4, to generate a DC voltage relative to the resonance voltage and 'Q' of the tuned circuit. This voltage then goes to a "window comparator". The limits of the "window" are determined by the values of resistors R13, R14 & R15. The outputs of two comparators are connected in parallel so that if the DC voltage is either below a given value (lower limit A) or above a second given value (upper limit B), the output will be pulled low. If the metal hose is not in place, the "Q" is high; the DC value is above upper limit B and the output is low. If the coil is broken or the sensor is not functioning correctly, the DC value is below the lower limit A and the output is also low. Only if the sensor is working properly and the hose is in place will the DC be mid level and output is high.

The effect of the metal hose in the coil diameter is to cause an inductance shift of only about 10% but the 'Q' may be reduced as much as 70% of the "no hose present" value resulting in a more reliable detection.

From the output of the window comparator there are 3 resistors R10, R11 & R12, that provide two voltages at the output to indicate hose in place or not. This output should be neither zero nor equal to the supply voltage. If zero, then the sensor is not connected; if at the supply voltage, the sensor is shorted to the supply line. This provides a complete sensor status monitor. R10 to the sensor supply provides a third voltage level if a failure of the sensor power occurs. R18 is a pull-up actually not part of the sensor but rather in the user's electronics.

Diodes D2 and D3 are in the negative feedback loop of the oscillator to compensate for frequency drift with temperature. The forward voltage drop of the diodes changes with temperature and compensates the feedback voltage.

Test points 1 and 2 are diagnostic purposes only.

Figure 6:
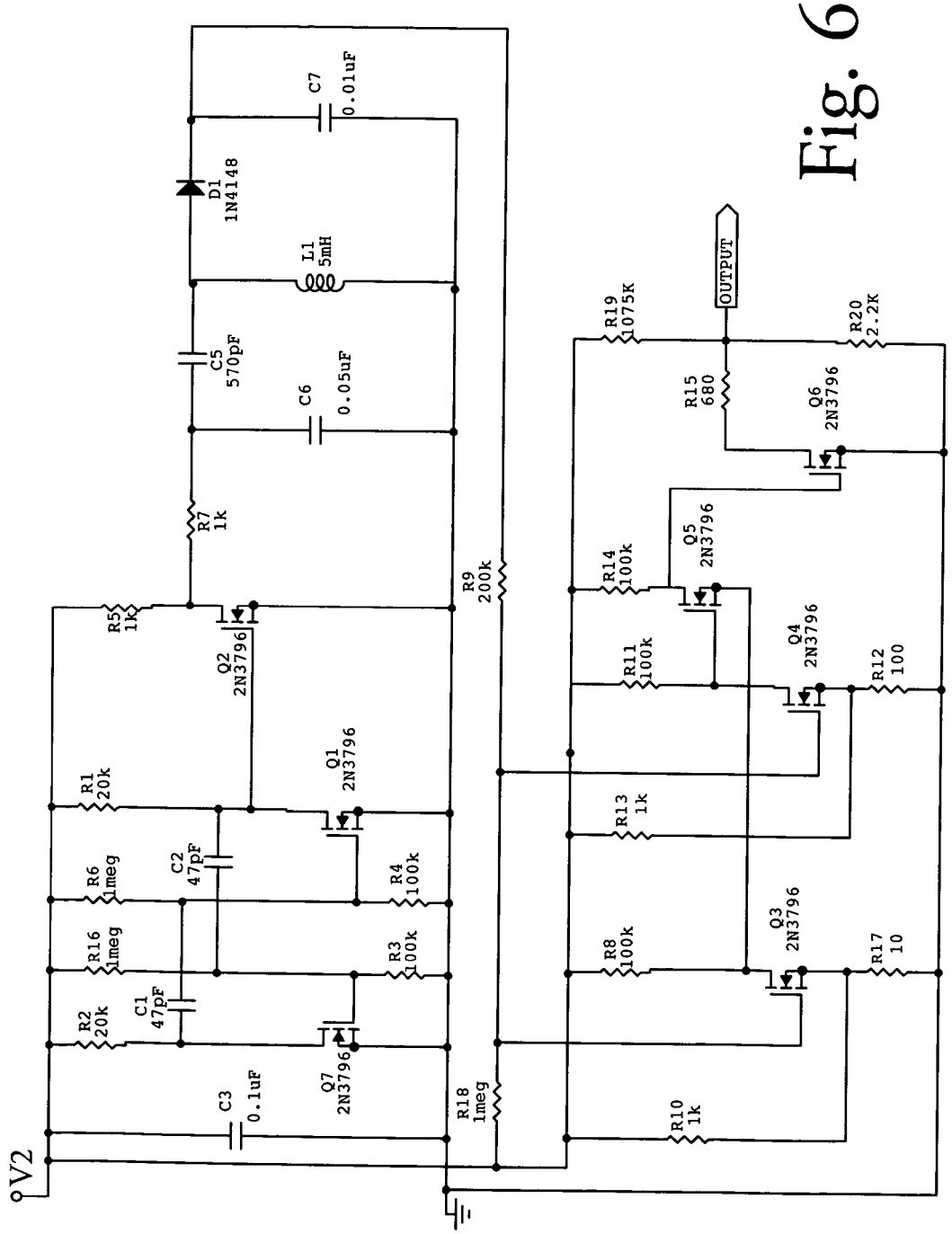
FIG. 6 is a schematic of an alternative circuit in accordance with the invention.

As shown in FIG. 6, an alternative embodiment of the circuit described in FIG. 5 is illustrated. In this embodiment, quad comparator providing elements 12, 14, 16, and 18 are replaced with discreet Field Effect Transistors. Preferably, 2N3796 FETs are used instead of the quad comparator LM2901DT. As one of ordinary skill in the art will recognize, there are many arrangements of various components and circuitry that will achieve the same outcome as provided by these two representative examples. Therefore, the components shown in FIGS. 5 and 6 are representative of only two ways of accomplishing the invention but can be adjusted using information well known in the art in accordance with the particular application that the invention is used for.

Although the present invention has been described with reference to certain preferred embodiments thereof, other versions are readily apparent to those of ordinary skill in the art of the preferred embodiments contained herein.

What is claimed is:

1. A sensor apparatus for determining if a hose constructed of at least partially metal at an attachment end is properly attached to a fitting, said apparatus comprising:
   a housing that is adapted to quickly connect and disconnect to the fitting;
   a coil attached within said housing wherein the hose at its attachment end is connected to said housing such that the hose passes through said coil;
   a printed circuit board within said housing and connected to said coil that detects whether the hose that is connected to said housing at its attachment end is in the correct position when said housing is connected to the fitting.

2. The sensor apparatus of claim 1 wherein said printed circuit board further comprises a simple oscillator having an output to provide a constant frequency to a resonant circuit.

3. The sensor apparatus of claim 2 wherein said oscillator has a sine wave output.

4. The sensor apparatus of claim 2 wherein said oscillator a square wave output.

5. The sensor apparatus of claim 2 further comprising at least one capacitor in combination with said coil having a resonance at the same frequency as said oscillator thus providing a resonant circuit.

6. The sensor apparatus of claim 5 wherein said at least one capacitor comprises two capacitors in series driven at a juncture between said two capacitors providing impedance matching from said oscillator to said resonant circuit.

7. The sensor apparatus of claim 5 further comprising circuitry that detects whether the attachment end of the hose is properly connected by utilizing a resulting shift in resonant frequency of said coil capacitor combination and a loss of "Q" due to a "shorted turn effect" produced by said at least partially metal end of the hose.

8. The sensor apparatus of claim 7 wherein said printed circuit board further comprising two comparators, each having a output and connected together to provide a voltage window such that if a DC voltage is above or below a predetermined value, that is, wherein the DC voltage is outside said voltage window, an output from said apparatus will indicate that circuitry of said apparatus is not functioning properly by showing "hose disconnected", thus said apparatus will fail safely.

9. The sensor apparatus of claim 8 further comprising a resistor network connected to said outputs of said two comparators wherein one of two voltages between ground and a supply voltage is provided such that any voltage output other than these two voltages will indicate abnormal sensor operation such as an unplugged sensor, output shorted to ground, output shorted to supply.

10. The sensor apparatus of claim 9 further comprising a resistor between the supply voltage and output to detect power loss.

11. The sensor apparatus of claim 2 further comprising at least one diode in said resonant circuit to compensate for temperature drift of said oscillator.

12. The sensor apparatus of claim 1 wherein said printed circuit board further comprises a quad comparator wherein one comparator provides an oscillator; a second comparator provides an oscillator buffer and a voltage window and output is provided using the remaining two comparator elements.

* * * * *